US007817838B2

(12) United States Patent
DiBella et al.

(10) Patent No.: US 7,817,838 B2
(45) Date of Patent: Oct. 19, 2010

(54) METHOD AND SYSTEM FOR CONSTRAINED RECONSTRUCTION OF IMAGING DATA USING DATA REORDERING

(75) Inventors: Edward V. R. DiBella, Salt Lake City, UT (US); Ganesh Sharma Adluru Venkata Raja, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 794 days.

(21) Appl. No.: 11/753,380

(22) Filed: May 24, 2007

(65) Prior Publication Data

US 2008/0292163 A1 Nov. 27, 2008

(51) Int. Cl.
*G06K 9/00* (2006.01)
(52) U.S. Cl. ..................................................... 382/131
(58) Field of Classification Search ........................ None
See application file for complete search history.

(56) References Cited

U.S. PATENT DOCUMENTS

| 5,245,282 | A | 9/1993 | Mugler, III et al. |
| 5,910,728 | A | 6/1999 | Sodickson |
| 5,969,524 | A | 10/1999 | Pierpaoli et al. |
| 6,320,380 | B1 | 11/2001 | Wu et al. |
| 6,661,925 | B1 | 12/2003 | Pianykh et al. |
| 6,717,406 | B2 | 4/2004 | Sodickson |
| 6,741,881 | B2 | 5/2004 | Prince |
| 6,804,546 | B1 | 10/2004 | Thompson et al. |
| 6,879,735 | B1 | 4/2005 | Portniaguine et al. |
| 7,132,828 | B2 | 11/2006 | Lustig et al. |
| 2003/0090729 | A1 | 5/2003 | Loce et al. |
| 2005/0033151 | A1 | 2/2005 | Wu et al. |
| 2005/0068031 | A1 | 3/2005 | Frank |
| 2005/0220265 | A1* | 10/2005 | Besson .......................... 378/16 |
| 2006/0229856 | A1 | 10/2006 | Burrus et al. |
| 2006/0257010 | A1 | 11/2006 | George et al. |
| 2007/0090837 | A1 | 4/2007 | Van Der Kouwe et al. |
| 2009/0123048 | A1* | 5/2009 | Leroux et al. ............... 382/131 |

OTHER PUBLICATIONS

Adluru, Ganesh, et al., "Reordering for Improved Constrained Reconstruction from Undersampled k-Space Data," International Journal of Biomedical Imaging, Article ID 341684, Oct. 2, 2008, 12 pages.
O. Portniaguine et al., "Inverse Methods for Reduced K-Space Acquisition" in *Proceedings of* ISMRM, pp. 481, Toronto, Canada; 2003.

(Continued)

*Primary Examiner*—Charles Kim
(74) *Attorney, Agent, or Firm*—Bell & Manning, LLC

(57) ABSTRACT

A method, system, and computer-readable medium are provided which perform reconstruction of an image from undersampled, multi-image k-space data. A first undersampled image dataset and a second undersampled image dataset defined in a first dimension are received. The first undersampled image dataset and the second undersampled image dataset define a multi-image dimension. An ordering for a plurality of pixels of the first dimension in the multi-image dimension is defined. The first undersampled image dataset and the second undersampled image dataset in the multi-image dimension are sorted based on the defined ordering. A first constraint is defined in the first dimension using the unsorted first and second undersampled image datasets. A second constraint is defined in the multi-image dimension using the sorted first and second undersampled image datasets. An image is reconstructed using the applied first constraint and the applied second constraint while preserving fidelity to the first undersampled image dataset and the second undersampled image dataset.

20 Claims, 8 Drawing Sheets

OTHER PUBLICATIONS

M. Lustig et al., "Sparse MRI: The Application of Compressed Sensing for Rapid MR Imaging" Magn Reson Med, available at http://www.stanford.edu~mlustig/SparsMRI.pdf , 2007.

G. Adluru et al., "Temporally Constrained Reconstruction of Dynamic Cardiac Perfusion MRI", 2007, Magnetic Resonance in Medicine, June ; 57(6): pp. 1027-1036.

G. Adluru et al., "Spatio-Temporal Constrained Reconstruction of Sparse Dynamic Contrast Enhanced Radial MRI Data", Proc. IEEE Int Symp BioMed. Imaging, pp. 109-112, Apr. 2007.

G. Adluru et al., "Constrained Reconstruction of Sparse Cardiac MRI DTI Data", Proc FIMH 2007, LNCS 4466, pp. 91-99.

* cited by examiner

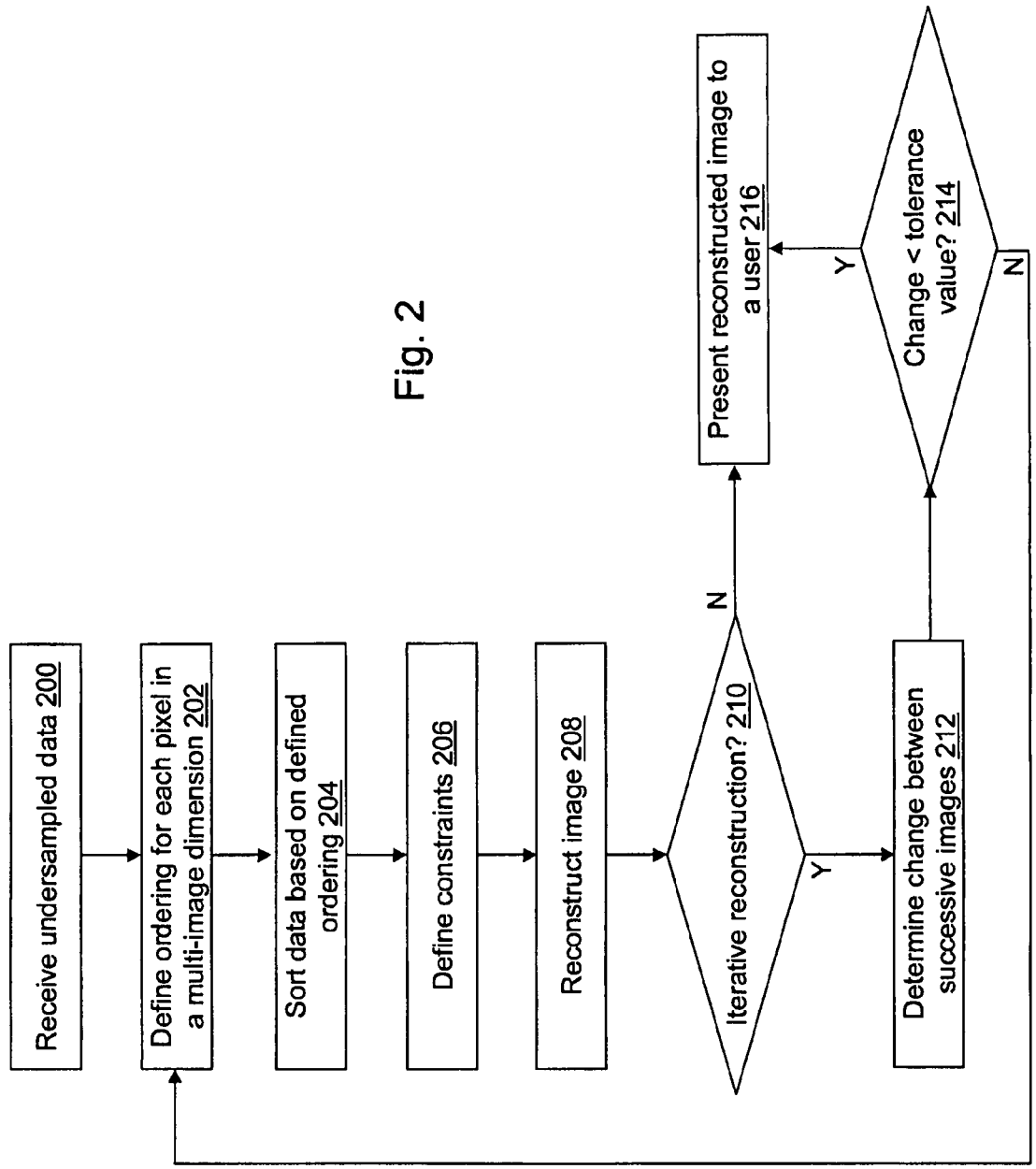

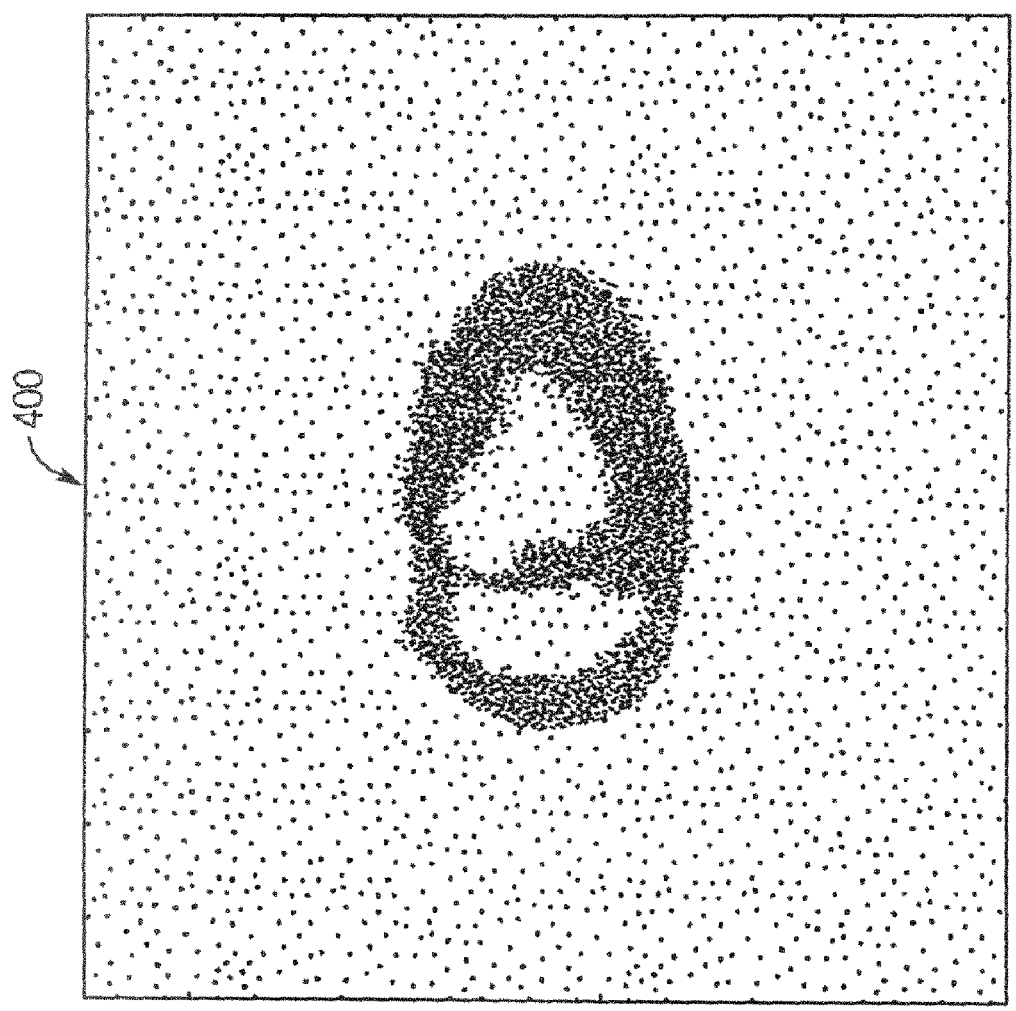

METHOD AND SYSTEM FOR CONSTRAINED RECONSTRUCTION OF IMAGING DATA USING DATA REORDERING

REFERENCE TO GOVERNMENT RIGHTS

This invention was made with United States government support awarded by the following agencies: National Institute of Health Grant No. EB000177. The United States government has certain rights in this invention.

FIELD

The field of the disclosure relates generally to joint reconstruction of multi-image datasets. More specifically, the disclosure relates to constrained reconstruction of images from magnetic resonance imaging systems using reordered data.

BACKGROUND

Magnetic resonance imaging (MRI) is an important diagnostic and imaging technique. MRI techniques are based on the absorption and emission of radio frequency (RF) energy by the nuclei of atoms. Typically, a target is placed in a strong magnetic field that causes the generally disordered and randomly oriented nuclear spins of the atoms to become aligned with the applied magnetic field. One or more RF pulses are transmitted into the target, perturbing the nuclear spins. As the nuclear spins relax to their aligned state, the nuclei emit RF energy that is detected by receiving coils disposed about the target. The received RF energy is processed into a magnetic resonance image of a portion of the target.

By utilizing non-uniform magnetic fields having gradients in each of three spatial dimensions, the location of the emitting nuclei can be spatially encoded so that the target can be imaged in three dimensions (3-D). The three dimensions are commonly two mutually orthogonal directions x and y defined in a plane denoted as a "slice" with a series of slices defined in a third mutually orthogonal direction z. Generally, RF pulses having a range of frequencies are transmitted into the target, and through use of well-known spatial encoding techniques, a set of MRI data is received by each of the receiver coils for each slice in the target.

MRI data provides a representation of the MRI image in the frequency domain, often called k-space domain, where $k_x$ and $k_y$ are the spatial frequency variables in the x and y directions having units of cycles per unit distance. An image of the slice of the target typically is obtained by performing an inverse Fourier transformation of the k-space MRI data. In MRI systems having multiple receiver coils (parallel MRI), an image is reconstructed from each receiver coil, and a final image is a combination of the images from each coil. Multiple receiver coil systems can be used to achieve high spatial and temporal resolution, to suppress image artifacts, and to reduce MRI scan time.

MRI data can be acquired at the appropriate Nyquist sampling rate to avoid artifacts in the final image caused by aliasing. However, sampling at the Nyquist rate is time consuming, which can prevent the imaging of targets that move, such as a beating heart. The reduction in the number of k-space samples steps to the Nyquist sampling rate is known as undersampling and is characterized by a reduction factor, R. Various undersampling strategies are possible. Non-uniform undersampling, also called variable-density undersampling, generally more densely samples a central region of k-space, and more sparsely samples an outer region. The undersampling results in certain data in k-space not being acquired, and therefore not available for image reconstruction. Thus, images reconstructed from undersampled data with standard methods have aliasing or other artifacts.

Multi-image MRI encompasses numerous important healthcare applications that acquire sets of images. Image sets from applications such as diffusion tensor imaging (DTI), which acquires diffusion weighted images in multiple directions, flow velocity imaging, dynamic contrast enhanced (DCE) imaging of tumors and perfusion, and cardiac motion are all examples of this multi-image class. DTI is an MRI technique that enables the measurement of the restricted diffusion of water in tissue through application of diffusion gradients (i.e. magnetic field variations in the MRI magnet) in at least 6 directions. A tensor (i.e. a symmetric positive definite 3×3 matrix) can be calculated that describes the 3-D shape of diffusion of water in the tissue. DTI is in widespread use for clinical indications and for study of the brain and heart and other applications. DCE is an MRI technique that probes the physiology of an organ or an area of interest over time. DCE MR imaging is used to track changes over time in an object of interest by acquiring a series of images. In this process, a contrast agent is injected into the body, or an endogenous contrast is used as in spin-labeling and images are acquired over time to track the uptake and washout patterns of an area of interest. Rapid acquisitions are required to track the quickly changing contrast in the object. One application of DCE MRI is myocardial perfusion, which is an important tool for assessing coronary artery disease.

It takes a relatively long time to acquire full data in k-space for each time frame without tradeoffs in spatial and temporal resolution. Additionally, the acquisition of full data for different diffusion directions takes a long time and limits the use of the technique. What is needed, therefore, is a method and a system for reducing the acquisition time of imaging data and/or for enabling improved spatial or temporal resolution or signal-to-noise ratio without an increase in acquisition time while maintaining the diagnostic quality of the image.

SUMMARY

A method and a system are provided which improve the quality of images reconstructed from multi-image data. In an exemplary embodiment, imaging data is undersampled in a pattern and reconstructed using an iterative constrained reconstruction process. The imaging data may be reordered using a variety of techniques to better match the reconstruction constraint (also termed regularization) criteria prior to application of the iterative constrained reconstruction process, leading to improved reconstructed images. Note that the data is only reordered for the use in the constraint term. The fidelity term is not altered. In an exemplary embodiment, each spatial location (pixel) of a multi-image dataset is reordered independently. Additionally, the real and imaginary or magnitude and phase parts of each pixel may be reordered independently prior to application of the constrained reconstruction.

In an exemplary embodiment, a system for reconstructing an image from undersampled, multi-image k-space data is provided. The system includes, but is not limited to, an imaging apparatus, a computer readable medium having computer-readable instructions therein, and a processor operably coupled to the computer-readable medium and configured to execute the computer-readable instructions. The imaging apparatus is configured to generate a first undersampled image dataset and a second undersampled image dataset defined in a first dimension. The instructions are programmed to receive the first undersampled image dataset and the second undersampled image dataset. The first undersampled image dataset and the second undersampled image dataset define a multi-image dimension. The instructions further are programmed to define an ordering for a plurality of pixels of the first dimension in the multi-image dimension, to sort the first undersampled image dataset and the second undersampled image dataset in the multi-image dimension based on the defined ordering, to define a first constraint in the first dimension using the unsorted first and second undersampled image datasets, to define a second constraint in the multi-image dimension using the sorted first and second undersampled image datasets, and to reconstruct an image using the applied first constraint and the applied second constraint while preserving fidelity to the first undersampled image dataset and the second undersampled image dataset.

In an exemplary embodiment, a device for reconstructing an image from undersampled, multi-image k-space data is provided. The device includes, but is not limited to, a computer-readable medium having computer-readable instructions therein and a processor. The processor is coupled to the computer-readable medium and is configured to execute the computer-readable instructions. The instructions are programmed to receive a first undersampled image dataset and a second undersampled image dataset defined in a first dimension. The first undersampled image dataset and the second undersampled image dataset define a multi-image dimension. The instructions further are programmed to define an ordering for a plurality of pixels of the first dimension in the multi-image dimension, to sort the first undersampled image dataset and the second undersampled image dataset in the multi-image dimension based on the defined ordering, to define a first constraint in the first dimension using the unsorted first and second undersampled image datasets, to define a second constraint in the multi-image dimension using the sorted first and second undersampled image datasets, and to reconstruct an image using the applied first constraint and the applied second constraint while preserving fidelity to the first undersampled image dataset and the second undersampled image dataset.

In another exemplary embodiment, a method of reconstructing an image from undersampled, multi-image k-space data is provided. A first undersampled image dataset and a second undersampled image dataset defined in a first dimension are received. The first undersampled image dataset and the second undersampled image dataset define a multi-image dimension. An ordering for a plurality of pixels of the first dimension in the multi-image dimension is defined. The first undersampled image dataset and the second undersampled image dataset in the multi-image dimension are sorted based on the defined ordering. A first constraint is defined in the first dimension using the unsorted first and second undersampled image datasets. A second constraint is defined in the multi-image dimension using the sorted first and second undersampled image datasets. An image is reconstructed using the applied first constraint and the applied second constraint while preserving fidelity to the first undersampled image dataset and the second undersampled image dataset.

In yet another exemplary embodiment, a computer-readable medium is provided. The computer-readable medium has computer-readable instructions therein that, upon execution by a processor, cause the processor to implement the operations of the method of reconstructing an image from undersampled, multi-image k-space data.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals denote like elements.

FIG. 2 depicts a flow diagram illustrating exemplary operations performed by the MRI data processing system of FIG. 1 in accordance with an exemplary embodiment.

FIGS. 4a-4c include MRI images comparing the performance of spatio-diffusion reconstruction using sorted data with spatio-diffusion reconstruction using unsorted data and with a reconstruction using a full k-space dataset accordance with an exemplary embodiment.

DETAILED DESCRIPTION

Figure 1:
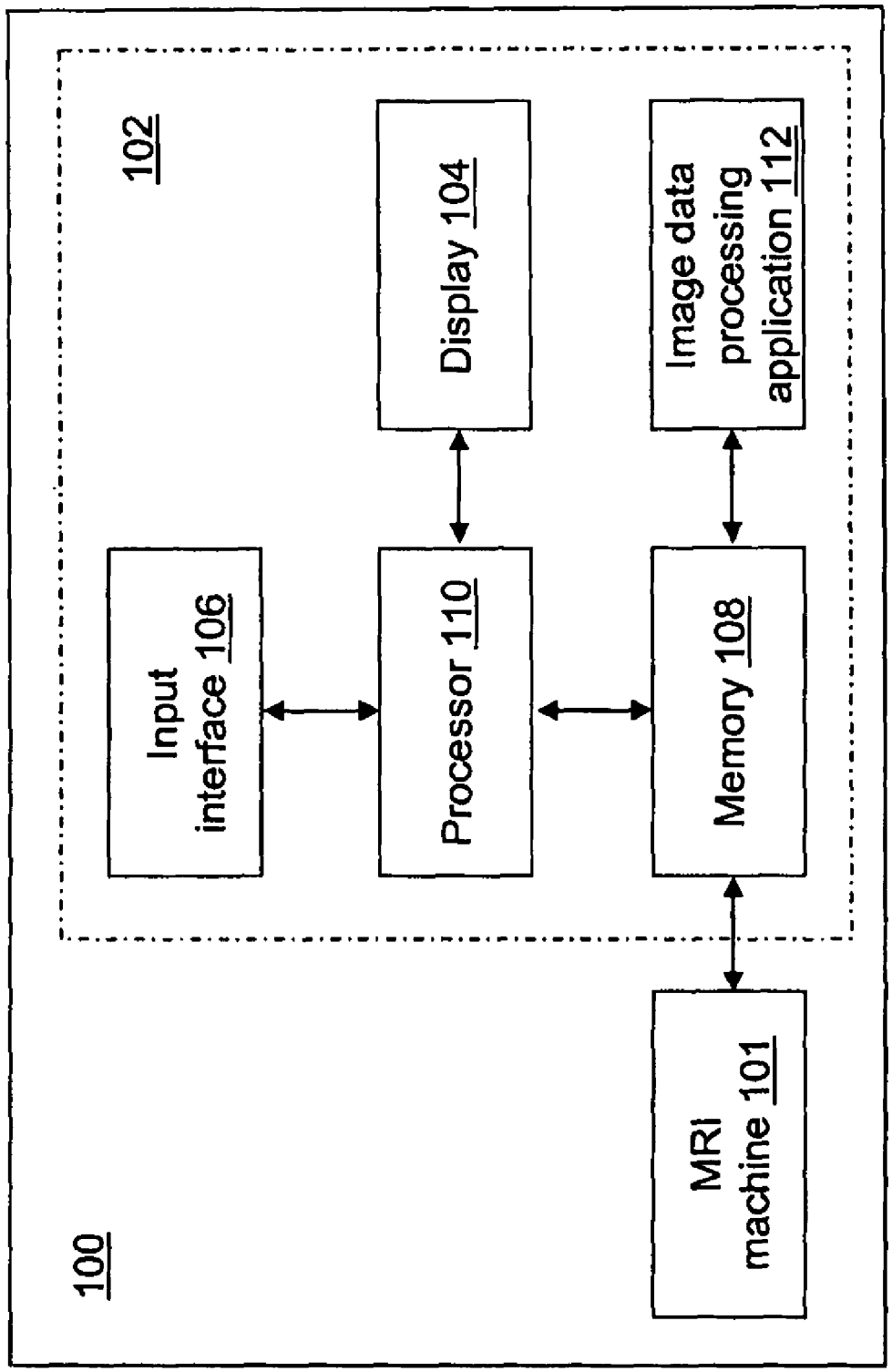
FIG. 1 depicts a block diagram of an MRI data processing system in accordance with an exemplary embodiment.

With reference to FIG. 1, a block diagram of an MRI data processing system 100 is shown in accordance with an exemplary embodiment. MRI data processing system 100 may include a magnetic resonance imaging (MRI) apparatus 101 and a computing device 102. Computing device 102 may include a display 104, an input interface 106, a memory 108, a processor 110, and an image data processing application 112. In the embodiment illustrated in FIG. 1, MRI machine 101 generates MRI image data of various types as known to those skilled in the art.

Computing device 102 may be a computer of any form factor. Different and additional components may be incorporated into computing device 102. Components of MRI data processing system 100 may be positioned in a single location, a single facility, and/or may be remote from one another. As a result, computing device 102 may also include a communication interface, which provides an interface for receiving and transmitting data between devices using various protocols, transmission technologies, and media as known to those skilled in the art. The communication interface may support communication using various transmission media that may be wired or wireless.

Display 104 presents information to a user of computing device 102 as known to those skilled in the art. For example, display 104 may be a thin film transistor display, a light emitting diode display, a liquid crystal display, or any of a variety of different displays known to those skilled in the art now or in the future.

Input interface 106 provides an interface for receiving information from the user for entry into computing device 102 as known to those skilled in the art. Input interface 106 may use various input technologies including, but not limited to, a keyboard, a pen and touch screen, a mouse, a track ball, a touch screen, a keypad, one or more buttons, etc. to allow the user to enter information into computing device 102 or to make selections presented in a user interface displayed on display 104. Input interface 106 may provide both an input and an output interface. For example, a touch screen both allows user input and presents output to the user.

Memory 108 is an electronic holding place or storage for information so that the information can be accessed by processor 110 as known to those skilled in the art. Computing device 102 may have one or more memories that use the same or a different memory technology. Memory technologies include; but are not limited to, any type of RAM, any type of ROM, any type of flash memory, etc. Computing device 102 also may have one or more drives that support the loading of a memory media such as a compact disk or digital video disk.

Processor 110 executes instructions as known to those skilled in the art. The instructions may be carried out by a special purpose computer, logic circuits, or hardware circuits. Thus, processor 110 may be implemented in hardware, firmware, software, or any combination of these methods. The term "execution" is the process of running an application or the carrying out of the operation called for by an instruction. The instructions may be written using one or more programming language, scripting language, assembly language, etc. Processor 110 executes an instruction, meaning that it performs the operations called for by that instruction. Processor 110 operably couples with display 104, with input interface 106, with memory 108, and with the communication interface to receive, to send, and to process information. Processor 110 may retrieve a set of instructions from a permanent memory device and copy the instructions in an executable form to a temporary memory device that is generally some form of RAM. Computing device 102 may include a plurality of processors that use the same or a different processing technology.

Image data processing application 112 performs operations associated with performing image reconstruction of undersampled image data. Some or all of the operations subsequently described may be embodied in image data processing application 112. The operations may be implemented using hardware, firmware, software, or any combination of these methods. With reference to the exemplary embodiment of FIG. 1, image data processing application 112 is implemented in software stored in memory 108 and accessible by processor 110 for execution of the instructions that embody the operations of image data processing application 112. Image data processing application 112 may be written using one or more programming languages, assembly languages, scripting languages, etc.

MRI machine 101 and computing device 102 may be integrated into a single system such as an MRI machine. MRI machine 101 and computing device 102 may be connected directly. For example, MRI machine 101 may connect to computing device 102 using a cable for transmitting information between MRI machine 101 and computing device 102. MRI machine 101 may connect to computing device 102 using a network. MRI image data may be stored electronically and accessed using computing device 102. MRI machine 101 and computing device 102 may not be connected. Instead, the MRI data acquired using MRI machine 101 may be manually provided to computing device 102. For example, the MRI data may be stored on electronic media such as a CD or a DVD. After receiving the MRI data, computing device 102 may initiate processing of the set of images that comprise an MRI study. In an exemplary embodiment, MRI machine 101 is a 1.5T or 3T scanner manufactured by Siemens, GE, or Philips, or small animal scanners manufactured by Bruker or others. MRI machines of a different type, field strength, manufacture, and model may be used in alternative embodiments without limitation.

The standard approach of acquiring full MRI data of an object often takes a long time and results in trade-offs in the volume coverage, the signal to noise ratio (SNR), and temporal and spatial resolution. Various approaches have been proposed to improve MRI by reducing the time required for the acquisition of MRI data by undersampling the data. For example, multiple-coil parallel imaging methods have recently been developed to aid in obtaining more information from single and multi-image MRI. While these techniques are valuable, they reduce the SNR. A new class of techniques employs a combination of a specific undersampling pattern and an iterative type of reconstruction. For example, a random undersampling pattern combined with an inverse problem type of reconstruction method that incorporates a constraint.

With reference to FIG. 2, exemplary operations associated with image data processing application 112 of FIG. 1 are described. Additional, fewer, or different operations may be performed, depending on the embodiment. Image data processing application 112 executes instructions associated with receiving MRI data that is undersampled in a pattern and reconstructing the MRI data using a constrained iterative reconstruction. The MRI data is reordered to better match the constraint portion of the reconstruction criteria, resulting in improved reconstructed images. The constrained reconstruction regularizes the data with appropriate constraints in space and diffusion direction dimensions and/or with appropriate constraints in space and temporal dimensions, etc. The constraints in the diffusion direction dimension and/or in the temporal dimension may be applied on the vector of complex intensity values for each spatial location (pixel) in the diffusion dimension and/or time dimension, respectively.

In an operation 200, undersampled MRI data is received. In an exemplary embodiment, variable density undersampling or other random/pseudo-random undersampling is used. The undersampling pattern varies along the multi-image dimension. Other undersampling methods also may be used including radial undersampling, uniform undersampling, interleaved undersampling, etc.

In an operation 202, an ordering for each pixel is defined in a multi-image dimension such as the diffusion direction dimension and/or temporal dimension. The vector of complex intensity values for each pixel are sorted a priori, for example, using training data to define an ordering for each pixel. The real and imaginary parts and/or magnitude and phase of the vector of complex intensity values also may be sorted independently. Sorting the complex vector based on the intensity values for real and imaginary parts helps avoid sudden high intensity variations in the diffusion dimension and/or time dimension and results in a relatively smooth and improved regularization of the data in the diffusion dimension and/or time dimension. In an exemplary embodiment, the training data may include central low resolution data obtained from variable density undersampling. In another exemplary embodiment, images may be obtained without reordering before operation 202, and the training data can be low resolution versions of the obtained images. In another exemplary embodiment, the reordering can be defined iteratively. For example, images may be obtained without reordering before operation 202 and used to choose a reordering based on the obtained images. Reconstruction may be performing using the reordering defined based on these images. The data reordering may be repeated using the reconstructed images until the change between successive iterations is less than a tolerance value. Other methods of defining the ordering for each pixel may be used.

Figure 3A:
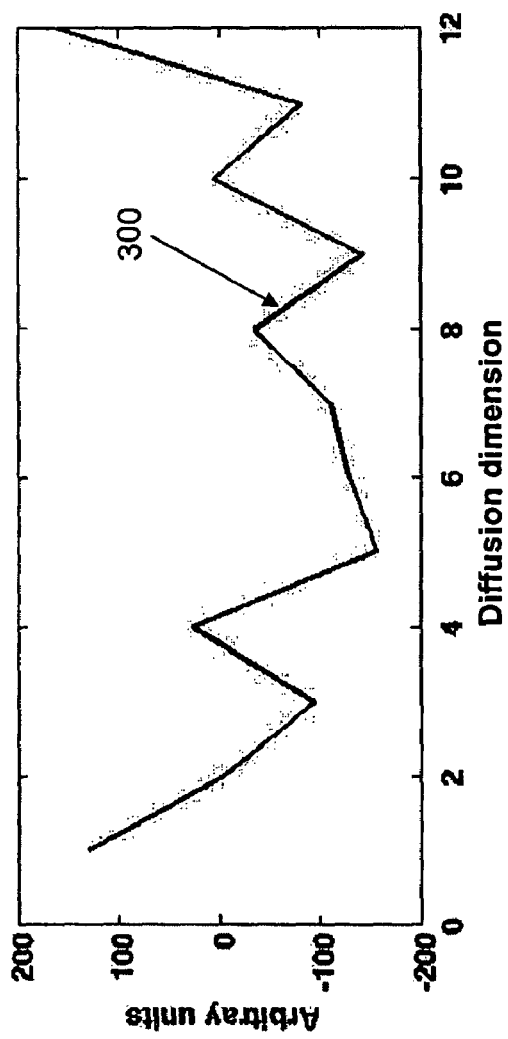
FIGS. 3a-3d are graphs illustrating unsorted versus sorted MRI data for a single pixel in accordance with an exemplary embodiment.
Figure 3B:
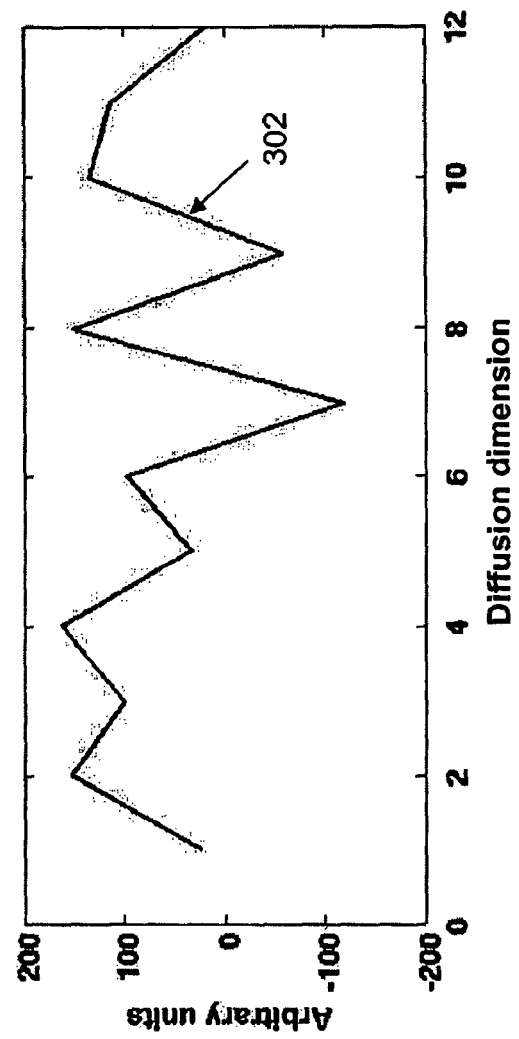
Figure 3C:
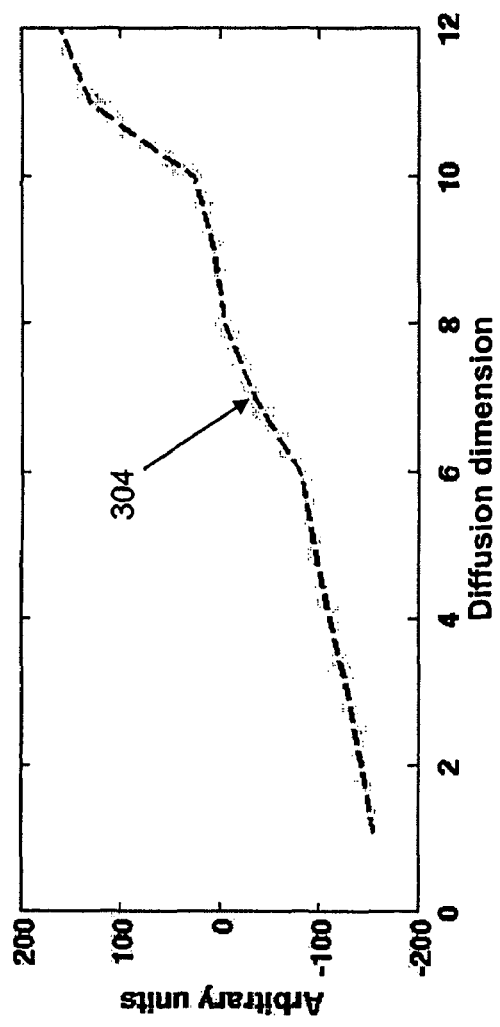
Figure 3D:
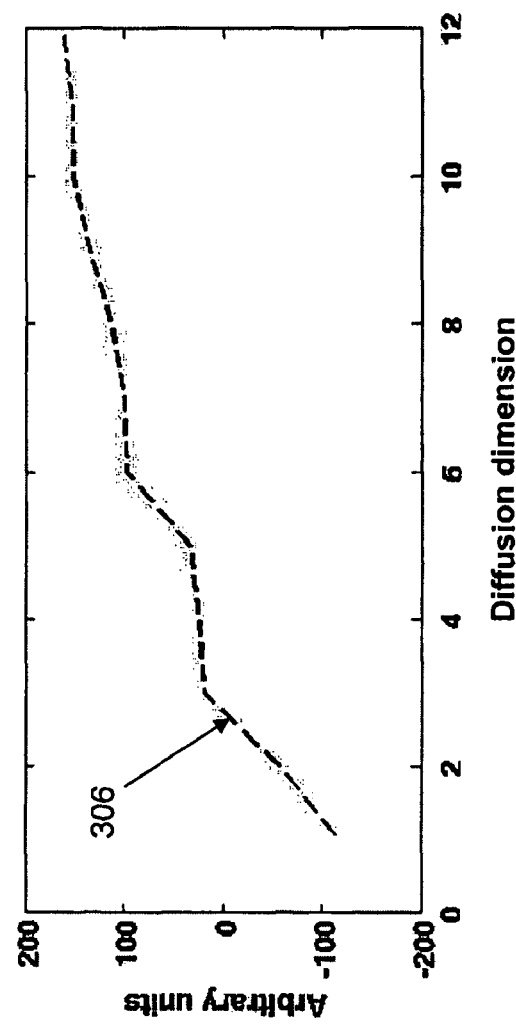

With reference to FIG. 3a, unsorted data 300 associated with a real component of a single pixel in a diffusion direction is shown. With reference to FIG. 3b, unsorted data 302 associated with an imaginary component of the single pixel in the diffusion direction is shown. With reference to FIG. 3c, sorted data 304 associated with the real component of the single pixel in the diffusion direction is shown. With reference to FIG. 3d, sorted data 306 associated with the imaginary component of the single pixel in the diffusion direction is shown. As shown with reference to FIGS. 3c and 3d, after the data are reordered, the curves are much smoother. This matches a smoothness constraint in the reconstruction much better and provides better reconstructions.

With continuing reference to FIG. 2, in an operation 204, the image data is sorted based on the defined ordering. In an operation 206, constraints are defined for application to the image data during the reconstruction process. For cardiac DTI, two constraints may be selected. In an exemplary embodiment, one constraint is in the diffusion weighting direction and the other is a spatial constraint in k-space. The constraint chosen in the diffusion weighting direction may be a total variation constraint. This constraint preserves the sharp gradients in the diffusion-weighting direction dimension for each pixel in the image while resolving the artifacts due to undersampling. This constraint is mathematically represented in equation (1):

$$D = \sum_{i=1}^{N} \left\| \sqrt{\nabla_d \hat{m}_i^2 + \beta^2} \right\|_1 \quad (1)$$

In equation (1), N is the total number of pixels in each image direction, $\nabla_d$ represents the rate of change in the diffusion weighting direction dimension, $\hat{m}_i$ is the reordered vector of complex pixel values in the diffusion weighting direction dimension of pixel i in the estimated image space data. $\beta$ is a small positive constant. In an exemplary embodiment, $\beta$ is defined based on the precision of MRI machine 101. In an exemplary embodiment, $\beta$ is on the order of $10^{-8}$ to $10^{-16}$ $\|\ \|_i$ represents the L1 norm.

The spatial constraint also may be a total variation constraint to preserve the spatial image gradients. An exemplary constraint is shown in equation (2):

$$S = \sum_{j=1}^{M} \left\| \sqrt{\nabla_x \tilde{m}_j^2 + \nabla_y \tilde{m}_j^2 + \beta^2} \right\|_1 \quad (2)$$

In equation (2), M represents total number of image directions in a given sequence for a single slice, $\nabla_x$ is the spatial gradient of the image in the x-direction, $\nabla_y$ is the spatial gradient in the y-direction and $\hat{m}_j$ represents the complex image data for direction j in the given sequence.

For DCE MRI, two constraints also may be selected. In an exemplary embodiment, one constraint is temporal and the other is the spatial constraint. In an exemplary embodiment, the temporal constraint is a maximum smoothness function based on the fact that, for fully sampled image data, the real and imaginary time curves for the pixels are generally smoothly varying in time. An exemplary constraint is shown in equation (3):

$$T = \sum_{i=1}^{N_2} \|\nabla_t \hat{m}_i\|_2^2 \quad (3)$$

In equation (3), $\nabla_t$ represents the temporal gradient operator, $N_2$ is the total number of pixels in each time frame, and $\hat{m}_i$ represents the reordered time curve for pixel i.

Different constraint terms may be used for any of the dimension constraints. For example, an L1 norm in equation (3) is useful when there is respiratory motion in DCE studies. In alternative embodiments, constraints may be applied to additional dimensions. For example, multiple slices may be constrained.

In an operation 208, the image data is reconstructed. The standard approach to reconstructing dynamic images from full k-space data is to apply an inverse 2D Fourier transform (IFT) on each time frame of data. Acquiring less data in k-space for each time frame (k-t space) results in aliasing or artifacts in image space. If a priori information is known about the data, the information can be incorporated into an iterative reconstruction to resolve the aliasing. Using a constrained reconstruction method including an appropriate model as a constraint removes artifacts from undersampling and preserves or increases the SNR. The standard discrete inverse Fourier reconstruction from full k-space data can be mathematically represented as d=Fm, where d represents the full data acquired in k-space for different time frames, m represents the complex image data, which is the corresponding series of images for the time frames, and F represents the 2D-Fourier transform on each time frame in the dynamic sequence. When full k-space data d are undersampled, and only sparse data, $\tilde{d}$, are acquired, aliasing occurs in the x-f space. A solution that resolves the aliasing can be obtained by finding a balance between fidelity to the acquired sparse data and incorporating one or more additional constraints that are satisfied by the full data.

In a first exemplary embodiment, reconstruction may be performed by minimizing a cost function C given in equation (4) using the constraints in equations (1) and (2) and preserving fidelity to the acquired undersampled data $$\min_m(c) = \min_m \left( \|WFm - \tilde{d}\|_2^2 + \alpha_1 \sum_{i=1}^{N_2} \left\| \sqrt{\nabla_d \hat{m}_i^2 + \beta^2} \right\|_1 + \alpha_2 \sum_{j=1}^{M} \left\| \sqrt{\nabla_x m_j^2 + \nabla_y m_j^2 + \beta^2} \right\|_1 \right) \quad (4)$$

In equation (4), W represents the binary sparsifying pattern used to obtain sparse k-space (acquired undersampled) data, $\tilde{d}$, and $\|\ \|_1$ represents the L2 norm. The term $\|WFm - \tilde{d}\|_2^2$ represents the data fidelity term that preserves fidelity to the acquired undersampled data. $\alpha_1$ and $\alpha_2$ are regularization parameters which are the weighting factors for the diffusion direction and spatial constraints, respectively, and typically are selected between 0 and 1. The weighting factors, $\alpha_1$ and $\alpha_2$ are selected such that there is a good balance between fidelity to the acquired data and satisfaction of the constraint. In an exemplary embodiment, an L-curve method may be used to determine an optimal weighting factor. For example, a norm of the data fidelity term may be plotted against a norm of the respective constraint term using a log-log plot to identify different values for the respective weighting factor. An optimal value of the respective weighting factor may be defined by the corner of the 'L' curve. In another exemplary embodiment, an L-surface method may be used to determine optimal values for multiple weighting factors. An exemplary L-surface method is described in M. Beige, M. E. Kilmer, E. L. Miller, "Efficient determination of Multiple Regularization Parameters in a Generalized L-curve Framework," Inverse Problems, Vol. 18, pp. 1161-1183, 2002.

An iterative gradient descent technique with finite forward differences may be used to minimize the cost function C. As known to those skilled in the art, many algorithms exist to minimize cost functions. For example, in another exemplary embodiment, a conjugate gradient method is used to minimize the cost function C. The complex image data may be updated iteratively according to equation (5):

$$m^{n+1} = m^n - \lambda C'(m^n); n = 0, 1, 2 \quad (5)$$

In equation (5), n represents the iteration number and $\lambda$ is the step size of the gradient descent method. In an exemplary embodiment, $\lambda$ is 0.5 or could be determined at each iteration with a line search. The initial estimate for $m^0$ may be all zeroes. In another exemplary embodiment, the initial estimate for $m^0$ may be defined as the series of images obtained by computing the IFT on each diffusion frame of acquired sparse data $\tilde{d}$. In yet another exemplary embodiment, the initial estimate for $m^0$ may defined using a sliding window to support faster convergence. Other initialization methods may be used. C'(m) is the Euler-Lagrange derivative of the cost function, C in equation (4) with respect to m, and is given in equation (6):

$$2 * \left( F^{-1}(WFm) - F^{-1}(\tilde{d}) - \alpha_1 \nabla_d \left( \frac{\nabla_d \hat{m}}{\sqrt{\nabla_d \hat{m}^2 + \beta^2}} \right) - \alpha_2 \left( \nabla_x \left( \frac{\nabla_x m}{\sqrt{\nabla_x m^2 + \nabla_y m^2 + \beta^2}} \right) + \nabla_y \left( \frac{\nabla_y m}{\sqrt{\nabla_x m^2 + \nabla_y m^2 + \beta^2}} \right) \right) \right) \quad (6)$$

In equation (6), $F^{-1}$ designates the IFT.

In a second exemplary embodiment, reconstruction may be performed by minimizing a cost function C given in equation (7) using the constraints in equations (2) and (3) and preserving fidelity to the acquired undersampled data.

$$\min_m(c) = \min_m \left( \|WFm - \tilde{d}\|_2^2 + \alpha_1 \sum_{i=1}^{N_2} \|\nabla_t \hat{m}_i\|_2^2 + \alpha_2 \sum_{j=1}^{M} \left\| \sqrt{\nabla_x m_j^2 + \nabla_y m_j^2 + \beta^2} \right\|_1 \right) \quad (7)$$

An iterative gradient descent technique with finite forward differences may be used to minimize the cost function C. As known to those skilled in the art, many algorithms exist to minimize cost functions. The complex image data may be updated iteratively according to equation (5) where C'(m) is the Euler-Lagrange derivative of the cost function, C in equation (7) with respect to $\hat{m}$. C'(m) for the second exemplary embodiment is given in equation (8):

$$2 * \left( F^{-1}(WFm) - F^{-1}(\tilde{d}) - \alpha_1 \nabla_t^2 \hat{m} - \alpha_2 \left( \nabla_x \left( \frac{\nabla_x m}{\sqrt{\nabla_x m^2 + \nabla_y m^2 + \beta^2}} \right) + \nabla_y \left( \frac{\nabla_y m}{\sqrt{\nabla_x m^2 + \nabla_y m^2 + \beta^2}} \right) \right) \right) \quad (8)$$

Thus, the reconstruction may be performed by minimizing a cost function C. C can be broadly written according to equation (9):

$$\min_m(c) = \min_m \left( \phi + \sum_{i=1}^{N} \alpha_i C_i \right) \quad (9)$$

In equation (9), $\phi$ represents the data fidelity term, $\|WFm - \tilde{d}\|_2^2$, which preserves fidelity to the acquired undersampled data, $\alpha_i$ is the regularization parameter for the constraint, and $C_i$ is the constraint.

In an operation 210, a determination is made concerning whether or not an iterative reordering process is used. If an iterative reordering process is used, processing continues at an operation 212. If an iterative reordering process is not used, processing continues at an operation 216. In operation 212, a determination of a change between successive images is determined. For example, a root-mean-squared difference value between the intensities of images in the current and previous iterations can be used as a measure of change. In an operation 214, a determination is made concerning whether or not the change is less than a tolerance value. A fraction of the mean squared value of the intensities of the images in the previous iteration can be used as a tolerance value in an exemplary embodiment. If the change is not less than the tolerance value, processing continues at operation 202 to define a reordering based on the reconstructed image. If the change is less than the tolerance value, processing continues at operation 216. The reconstructed image may be presented to a user of computing device 102 in operation 216.

The operations of FIG. 2 may be repeated for multiple time frames and/or multiple slices of data if either of these multi-image dimensions is not used to form the reconstructed image. For example, multiple slices may be used in defining the ordering for each pixel. The order of presentation of the operations of FIG. 2 is not intended to be limiting. The reconstructed images also may be stored to memory 108.

Figure 4B:
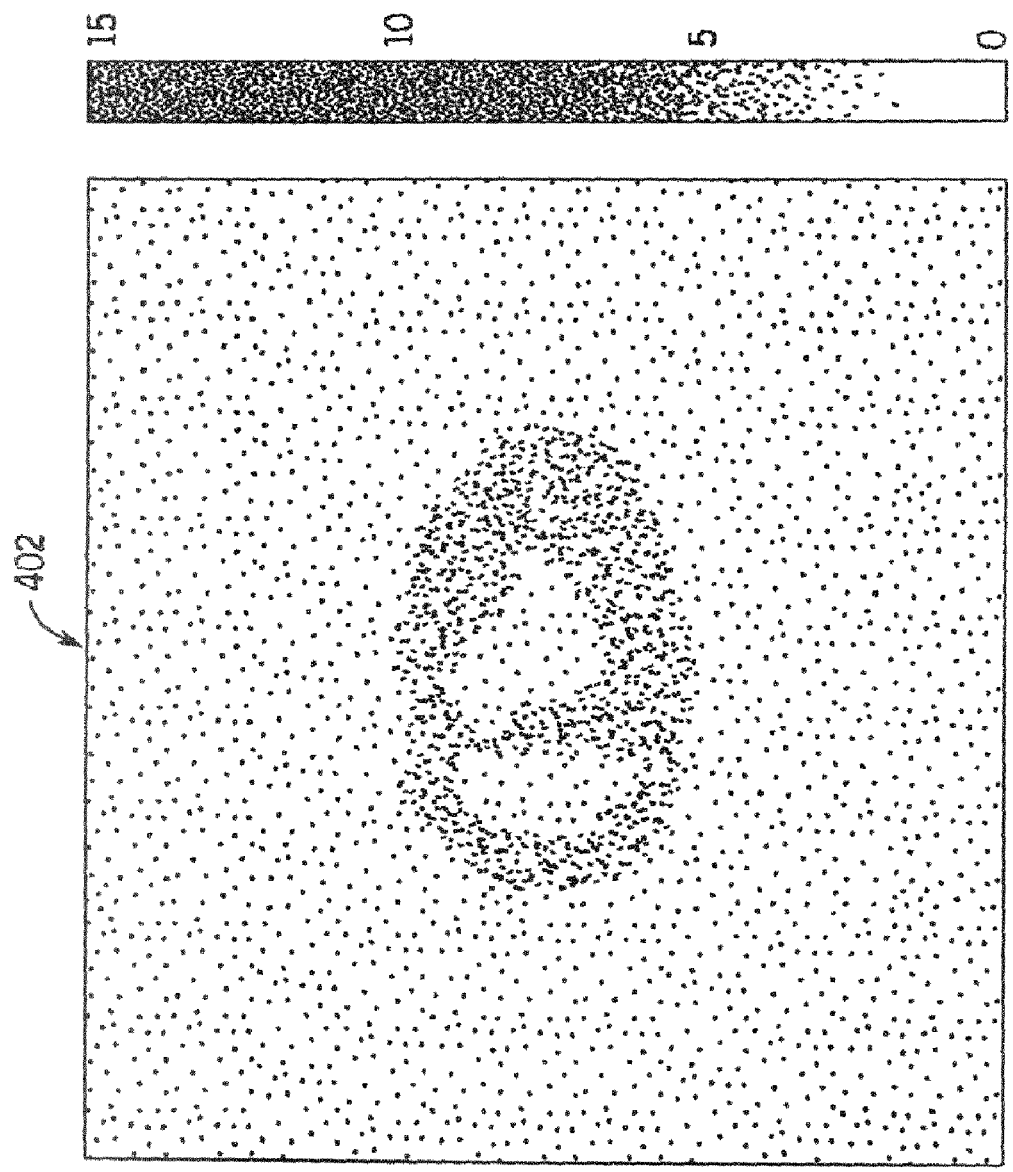
Figure 4C:
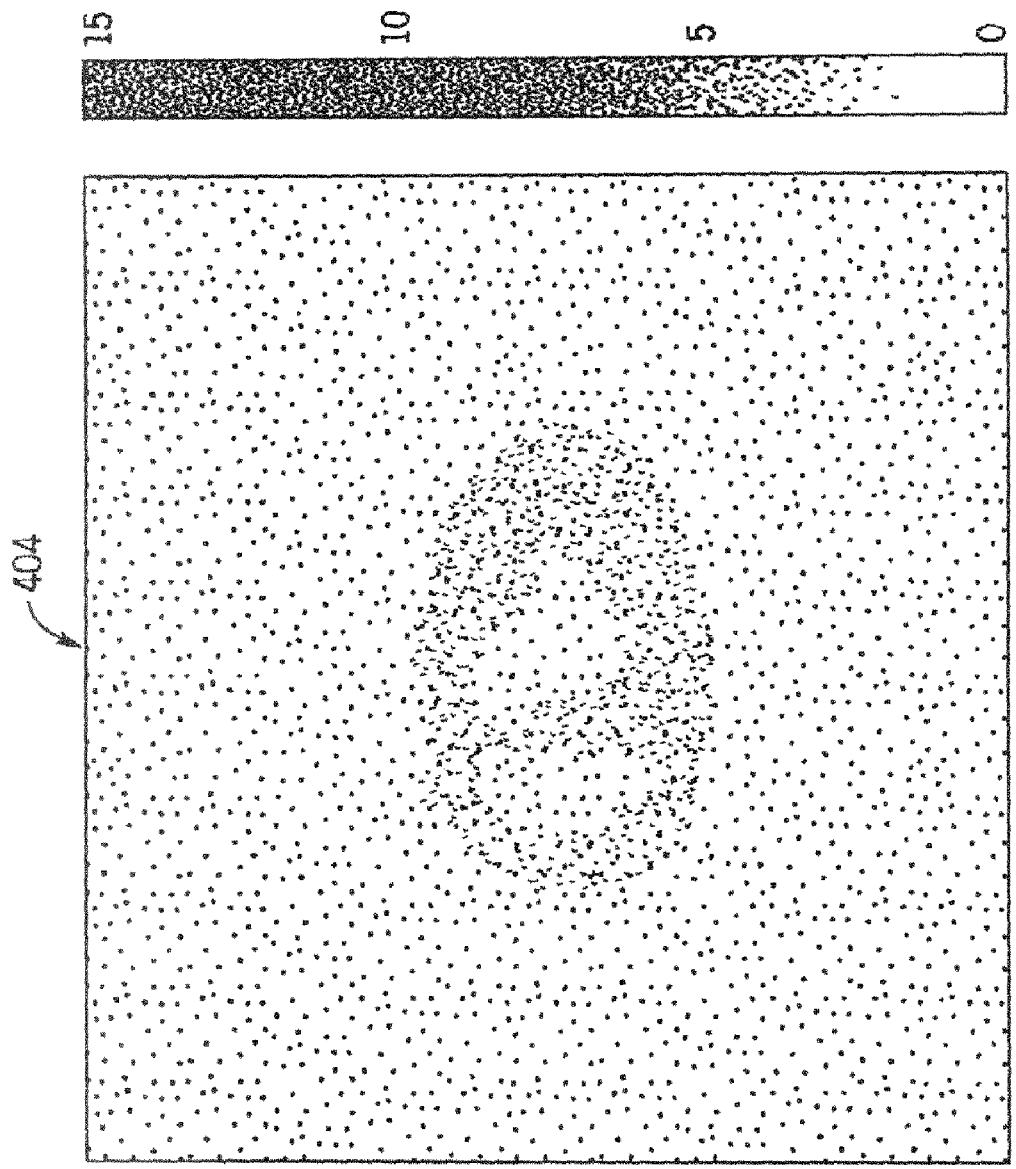

With reference to FIGS. 4a-4c, images reconstructed with and without data reordering using DTI MRI data are shown. With reference to FIG. 4a, a first image 400 was constructed using a full MRI dataset (12 diffusion weighted images, 256× 256 matrix size, 10 centimeter (cm) field-of-view of an ex-vivo sheep heart) and an inverse Fourier transform as known to those skilled in the art. With reference to FIG. 4b, a second image 402 was constructed by calculating a difference between first image 400 and an image constructed using the constrained reconstruction process according to equation (4) from ~50% of the full data sampled in a variable density fashion, without reordering of the MRI dataset. With reference to FIG. 4c, a third image 404 was constructed by calculating a difference between first image 400 and an image constructed using the constrained reconstruction process according to equation (4) from ~50% of the full data sampled in a variable density fashion, with reordering of the MRI dataset done using the full data. In both cases, FIG. 4b and FIG. 4c, the initial estimate for the images was all zeros and the minimization of cost function C in equation (4) was done using a gradient descent method. As shown with reference to FIG. 4c, only minor differences are indicated between first image 400 and an image reconstructed using the constrained reconstruction process with reordering of the MRI dataset.

Figure 5C:
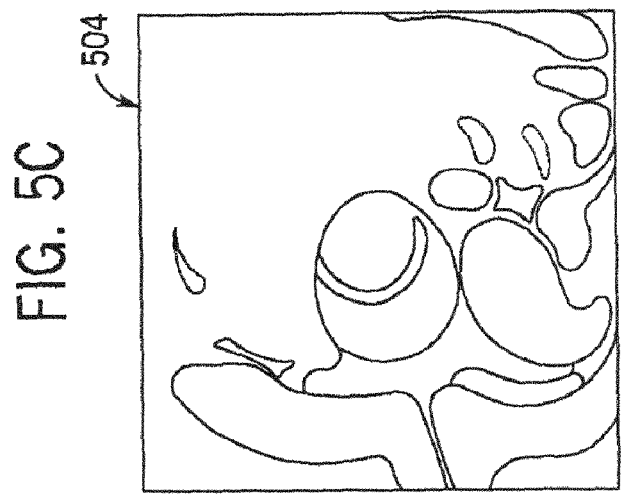
FIGS. 5a-5c include MRI images comparing the performance of spatio-temporal reconstruction using sorted data with spatio-temporal reconstruction using unsorted data and with a reconstruction using a full k-space dataset accordance with an exemplary embodiment.
Figure 5B:
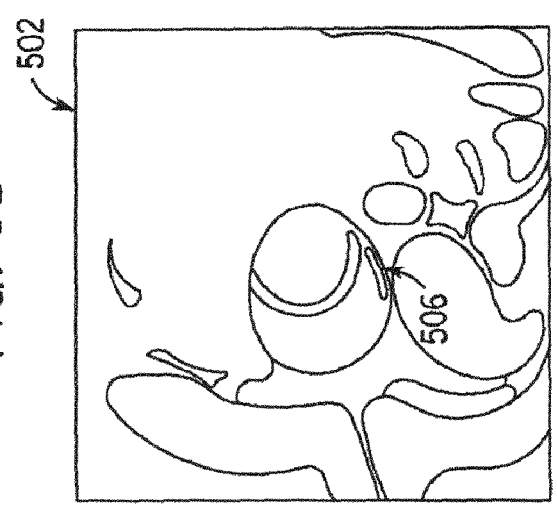
Figure 5A:
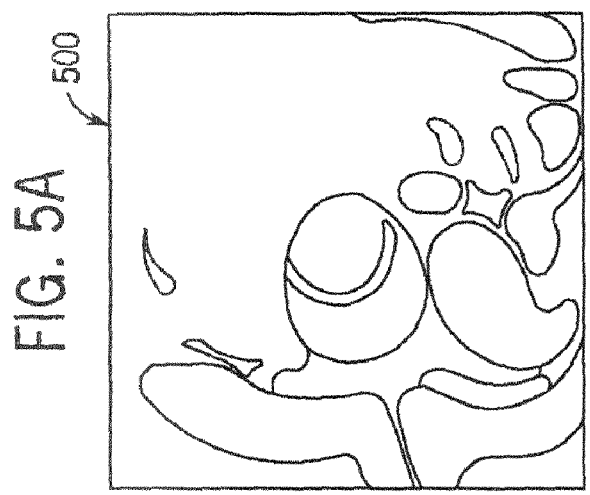

With reference to FIGS. 5a-5c, images reconstructed with and without data reordering using perfusion data are shown. With reference to FIG. 5a, a first image 500 was constructed using a full MRI dataset and an inverse Fourier transform as known to those skilled in the art. The cardiac perfusion data was acquired on a Siemens Trio 3T scanner using an eight channel cardiac coil. A turboFLASH saturation recovery sequence with scan parameters TR=140 milliseconds (msec), TE=0.98 msec and a slice thickness of 7 millimeters was used. The gadolinium-DTPA dose was 0.09 millimole/kilogram. With reference to FIG. 5b, a second image 502 was constructed using the constrained reconstruction process according to equation (4) from ~33% of the full data sampled in a variable density fashion, without reordering of the MRI dataset. With reference to FIG. 5c, a third image 504 was constructed using the constrained reconstruction process according to equation (4) from ~33% of the full data sampled in a variable density fashion, with reordering of the MRI dataset done from the central low resolution k-space data from the variable density undersampling. In both cases, FIG. 5b and FIG. 5c, the initial estimate for the images was all zeros and the minimization of the cost function C in equation (4) was done using a gradient descent method. The quality of the reconstructed image in FIG. 5c is visible over that shown in FIG. 5b. For example, a bright line 506 is removed using the data reordering approach. While this improvement may appear to be a small improvement, it can be important when looking for a clinical diagnosis.

Although the results presented include DTI and myocardial perfusion applications, the reordering can be used to improve reconstructions for many other applications including tumor DCE, flow velocity imaging, beating heart images, and MRI temperature measurements, parallel reconstruction, etc. In general, the present techniques are well-suited for use with a wide variety of medical diagnostic system modalities that acquire multi-image datasets, including computed tomography systems, ultrasound systems, positron emission tomography systems, nuclear medicine systems, electrocardiograph, etc. Moreover, the various modality systems may be of a different type, manufacture, and model. Additionally, the reordering can be used to improve reconstructions using a complete k-space dataset where R=1 instead of an undersampled dataset.

The word "exemplary" is used herein to mean serving as an example, instance, or illustration. Any aspect or design described herein as "exemplary" is not necessarily to be construed as preferred or advantageous over other aspects or designs. Further, for the purposes of this disclosure and unless otherwise specified, "a" or "an" means "one or more". The exemplary embodiments may be implemented as a method, apparatus, or article of manufacture using standard programming and/or engineering techniques to produce software, firmware, hardware, or any combination thereof to control a computer to implement the disclosed embodiments. The term "computer readable medium" can include, but is not limited to, magnetic storage devices (e.g., hard disk, floppy disk, magnetic strips, . . . ), optical disks (e.g., compact disk (CD), digital versatile disk (DVD), . . . ), smart cards, flash memory devices, etc. Additionally, it should be appreciated that a carrier wave can be employed to carry computer-readable media such as those used in transmitting and receiving electronic mail or in accessing a network such as the Internet or a local area network (LAN). The network access may be wired or wireless.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The functionality described may be implemented in a single executable or application or may be distributed among modules that differ in number and distribution of functionality from those described herein. Additionally, the order of execution of the functions may be changed depending on the embodiment. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system for reconstructing an image from undersampled, multi-image k-space data, the system comprising:
    an imaging apparatus configured to generate a first undersampled image dataset defined in a first dimension and to generate a second undersampled image dataset defined in the first dimension;
    a computer-readable medium having computer-readable instructions stored therein which are programmed to
    (a) receive the first undersampled image dataset;
    (b) receive the second undersampled image dataset, the first undersampled image dataset and the second undersampled image dataset defining a multi-image dimension;
    (c) define an ordering for a plurality of pixels of the first dimension in the multi-image dimension;
    (d) sort the first undersampled image dataset and the second undersampled image dataset in the multi-image dimension based on the defined ordering;
    (e) define a first constraint in the first dimension using the unsorted first and second undersampled image datasets;
    (f) define a second constraint in the multi-image dimension using the sorted first and second undersampled image datasets; and
    (g) reconstruct an image using the applied first constraint and the applied second constraint while preserving fidelity to the first undersampled image dataset and the second undersampled image dataset; and
    a processor operably coupled to the computer-readable medium and configured to execute the instructions.

2. A non-transitory computer-readable medium including computer-readable instructions that, upon execution by a processor, cause the processor to reconstruct an image from undersampled, multi-image k-space data, the instructions configured to cause a computing device to:
    (a) receive a first undersampled image dataset defined in a first dimension;
    (b) receive a second undersampled image dataset defined in the first dimension, the first undersampled image dataset and the second undersampled image dataset defining a multi-image dimension;
    (c) define an ordering for a plurality of pixels of the first dimension in the multi-image dimension;
    (d) sort the first undersampled image dataset and the second undersampled image dataset in the multi-image dimension based on the defined ordering;
    (e) define a first constraint in the first dimension using the unsorted first and second undersampled image datasets;
    (f) define a second constraint in the multi-image dimension using the sorted first and second undersampled image datasets; and
    (g) reconstruct an image using the applied first constraint and the applied second constraint while preserving fidelity to the first undersampled image dataset and the second undersampled image dataset.

3. A method of reconstructing an image from undersampled, multi-image k-space data, the method comprising:
    (a) receiving a first undersampled image dataset defined in a first dimension;
    (b) receiving a second undersampled image dataset defined in the first dimension, the first undersampled image dataset and the second undersampled image dataset defining a multi-image dimension;
    (c) defining an ordering for a plurality of pixels of the first dimension in the multi-image dimension;

(d) sorting the first undersampled image dataset and the second undersampled image dataset in the multi-image dimension based on the defined ordering;

(e) defining a first constraint in the first dimension using the unsorted first and second undersampled image datasets;

(f) defining a second constraint in the multi-image dimension using the sorted first and second undersampled image datasets; and (g) reconstructing an image using the applied first constraint and the applied second constraint while preserving fidelity to the first undersampled image dataset and the second undersampled image dataset.

4. The method of claim 3, further comprising repeating (a)-(g) for a plurality of timeframes.

5. The method of claim 3, wherein reconstructing the image comprises minimizing a cost function.

6. The method of claim 5, wherein minimizing the cost function comprises applying an iterative gradient descent with finite forward differences solution.

7. The method of claim 5, wherein preserving fidelity to the first undersampled image dataset and the second undersampled image dataset comprises minimizing the cost function with a term $\phi$ where $\phi = \|WF\tilde{m} - \tilde{d}\|_2^2$, and further wherein W represents a binary sparsifying pattern used to obtain the first undersampled image dataset and the second undersampled image dataset, F represents a Fourier transform, $\tilde{m}$ represents image data, $\tilde{d}$ represents the first undersampled image dataset and the second undersampled image dataset, and $\|\ \|_2$ represents the L2 norm.

8. The method of claim 7, wherein the cost function comprises $$\phi + \sum_{i=1}^{N} \alpha_i C_i,$$

where $\alpha_i$ is a regularization parameter for a constraint, $C_i$ is the constraint, and N is the number of constraints.

9. The method of claim 8, wherein minimizing the cost function comprises iteratively updating the image data according to $\tilde{m}^{n+1} = \tilde{m}^n - \lambda C'(\tilde{m}^n)$, where n represents an iteration number, $\lambda$ is a step size of a gradient descent method, and $C'(\tilde{m})$ is an Euler-Lagrange derivative of the cost function.

10. The method of claim 3, wherein the first undersampled image dataset comprises magnetic imaging resonance (MRI) data.

11. The method of claim 10, wherein the MRI data includes at least one of dynamic contrast enhanced data, diffusion tensor imaging data, perfusion data, flow velocity imaging data, beating heart data, and temperature measurement data.

12. The method of claim 3, wherein the first dimension is a spatial dimension.

13. The method of claim 3, wherein the second dimension is selected from a temporal dimension, a diffusion direction dimension, and a multiple slice dimension.

14. The method of claim 3, wherein the first constraint is a total variation constraint.

15. The method of claim 3, wherein the second constraint is selected from a total variation constraint and a maximum smoothness function constraint.

16. The method of claim 3, wherein defining the ordering for the plurality of pixels comprises independently ordering a real component and an imaginary component for each pixel.

17. The method of claim 3, further comprising identifying training data, wherein defining the ordering for the plurality of pixels uses the identified training data.

18. The method of claim 17, wherein the identified training data comprises data obtained from a third undersampled image dataset.

19. The method of claim 17, wherein identifying the training data comprises:

(h) receiving the first undersampled image dataset defined in the first dimension;

(i) receiving the second undersampled image dataset defined in the first dimension, the first undersampled image dataset and the second undersampled image dataset defining the multi-image dimension;

(j) defining the first constraint in the first dimension to the first and second undersampled image datasets;

(k) defining the second constraint in the multi-image dimension to the first and second undersampled image datasets; and (l) reconstructing a first image using the applied first constraint and the applied second constraint while preserving fidelity to the first undersampled image dataset and the second undersampled image dataset, wherein the identified training data comprises the reconstructed first image.

20. The method of claim 19, further comprising:

(m) repeating (a)-(g) to reconstruct a second image using the reconstructed image to define the ordering for the plurality of pixels;

(n) calculating a difference between the reconstructed image and the reconstructed second image;

(o) comparing the calculated difference with a tolerance value, and (p) repeating (a)-(g) and (m)-(o) until the comparison is satisfied with the reconstructed second image as the reconstructed image.

* * * * *